United States Patent [19]

Cassiday et al.

[11] 4,275,404
[45] Jun. 23, 1981

[54] MONOLITHIC OPTO-ISOLATOR

[75] Inventors: Daniel R. Cassiday, Martinsville; Vassilis G. Keramidas, Warren; Ronald J. Roedel, Martinsville; Robert H. Saul, Scotch Plains, all of N.J.

[73] Assignee: Bell Telephone Laboratories, Incorporated, Murray Hill, N.J.

[21] Appl. No.: 82,007

[22] Filed: Oct. 5, 1979

[51] Int. Cl.$^3$ .............................................. H01L 31/12
[52] U.S. Cl. ........................................ 357/19; 357/17; 357/18; 357/55
[58] Field of Search ...................... 357/19, 17, 18, 55

[56] References Cited

U.S. PATENT DOCUMENTS

| 4,136,928 | 1/1979 | Logan | 350/96.11 |
| 4,152,044 | 5/1979 | Liu | 350/96.12 |

Primary Examiner—Martin H. Edlow
Attorney, Agent, or Firm—Richard D. Laumann

[57] ABSTRACT

A monolithic opto-isolator is fabricated on an insulating substrate by using a graded bandgap semiconductor material for the LED and photodetector and spacing the LED from the photodetector with insulating channels.

6 Claims, 4 Drawing Figures

MONOLITHIC OPTO-ISOLATOR

TECHNICAL FIELD

This invention is concerned generally with opto-isolators and particularly with monolithic opto-isolators, i.e., opto-isolators fabricated on a single chip.

BACKGROUND OF THE INVENTION

In many practical applications, it is desired to transmit signals between two electrical circuits that are electrically isolated from each other. Due to a desire for small device size and complete electrical isolation between the circuits, four terminal devices, commonly called opto-isolators, have been developed. These devices utilize optical coupling, rather than the electrical coupling used in transformers and relays, to link the two electrical circuits. Opto-isolators use a light source, commonly a light emitting diode (LED), located in the electrical input circit and a photodetector, located in the electrical output circuit and optically coupled to the light source, to couple the two electrical circuits. Current flowing in the input circuit causes the LED to emit light, and some of this light is received by the photodetector and causes an electrical current to flow in the output circuit. It should be understood that the term, "light", as used in this specification, refers to electromagnetic radiation in both the visible and infrared regions.

Opto-isolators typically use discrete devices, that is, the light source and photodetectors are manufactured separately and individually positioned in an optical cavity to form the opto-isolator. The light source is connected to two input terminals, and the photodetector is connected to two output terminals. The light source and photodetector are generally formed from different materials. For example, opto-isolators commonly used today have LEDs made from Group III-V compounds, such as GaAs, GaP, $GaAs_{1-x}P_x$ and $Ga_{1-x}Al_xAs$, and Si photodetectors. The presence of discrete devices means that considerable care has to be exercised in positioning the LED and the photodetector, both with respect to each other and the cavity, to obtain efficient light coupling. Additionally, cavity construction and the material used to form the cavity are often critical.

For reasons of manufacturing economics, as well as efficient coupling of light between the light source and detector, a monolithic or integrated opto-isolator would be desirable. Such a device would be fabricated on a single semiconductor chip from a single semiconductor material, i.e., both the light source and light detector would consist of the same semiconductor material. The use of a single material and a single chip affords the possibility of simplicity of fabrication as positioning of the LED and photodetector with respect to each other may be accomplished automatically. The automatic positioning of LED and photodetector with respect to each other may reduce optical losses due to misalignment of LED and photodetector.

Fabrication of a monolithic opto-isolator has been attempted. For example, U.S. Pat. No. 3,705,309 discloses an opto-isolator using a thin film to optically couple an electroluminescent region and a photoconductive region. One embodiment of the device uses an optically conducting semiconducting film with the light generating and light detecting regions produced in the film by two separate diffusion steps. Metal electrodes are attached to the thin film and permit appropriate biasing of both the light generating and light detecting regions. The thin film may be made from a single Group II-VI or Group III-V semiconductor material such as zinc sulfide or gallium arsenide.

While perfectly adequate for some uses, the described and similar devices have drawbacks which are undesirable and limit the number of situations in which they can be used successfully. One drawback of the described device arises because the region between the elecroluminescent and photoconductive regions is electrically conducting and, as a result, only relatively small differences in potential between the electrode pairs may be tolerated before the device breaks down. Another drawback arises because some light is lost, i.e., not received by the photoconductive region, both to the left and through the top of the device because of the position of the electroluminescent junction. There is only one photoconductive region, and the electrode size cannot be increased to reflect light back into the thin film and, thus, reduce light losses through the top of the device, because the electrode must remain electrically isolated from the other conductivity regions. The coupling efficiency between light source and light detector of the device is thus limited. Finally, the thin film, including both the light source and light detector, in the embodiment described is made from the same material, and the semiconductor material forming the intermediate region between the light emitter and detector has a bandgap equal to that of the emitting region. As a result, the intermediate region is an efficient absorber of the emitted light, and the device coupling efficiency is again decreased.

SUMMARY OF THE INVENTION

We have found that a monolithic opto-isolator may be constructed with the light source and light detector being disposed on a substrate, typically insulating, and formed from the same epitaxially grown Group II-VI or Group III-V semiconductor compounds, and mixtures thereof, having a graded bandgap. The light source, typically a light emitting diode (LED) having p-type and n-type regions, and light detector, also having p-type and n-type regions, are isolated from each other by channels which typically go through the semiconductor material and extend into a portion of the substrate. The p-type and n-type regions form p-n junctions in the LED and the photodetector. The channels are conveniently formed with techniques such as etching, sawing or proton implantation after the material is epitaxially grown. Electrical contacts are attached by conventional techniques to the n- and p-type regions of both the LED and the photodetector. The electrical contacts to the LED form the input terminals of the opto-isolator, and the electrical contacts to the photodetector form the output terminals of the opto-isolator. Some of the photons emitted by the LED, when it is appropriately biased, are absorbed within several diffusion lengths of the photodetector p-n junction and cause an electrical current to flow in the output circuit connected between the output terminals. The insulating substrate allows high breakdown voltage to be achieved.

In one preferred embodiment, gallium aluminum arsenide (GaAl)As is used, and the desired graded bandgap is obtained by varying the aluminum content with the distance from the substrate. The semiconductor composition varies from approximately $Ga_{0.7}Al_{0.3}As$ at the substrate to GaAs at the point most remote from the substrate, and is approximately $Ga_{0.92}Al_{0.08}As$ at the p-n junction of the LED. The LED is center-positioned and spaced from two photodetectors by two parallel channels which extend through the semiconductor and into a portion of the substrate. In a second preferred embodiment using (GaAl)As, the LED is center positioned and spaced from a concentric photodetector.

DETAILED DESCRIPTION

It is believed that the invention will be best understood if specific embodiments are discussed first. After such embodiments are described, several contemplated variations will be mentioned, and other variations will then be readily apparent to those skilled in the art.

Figure 1:
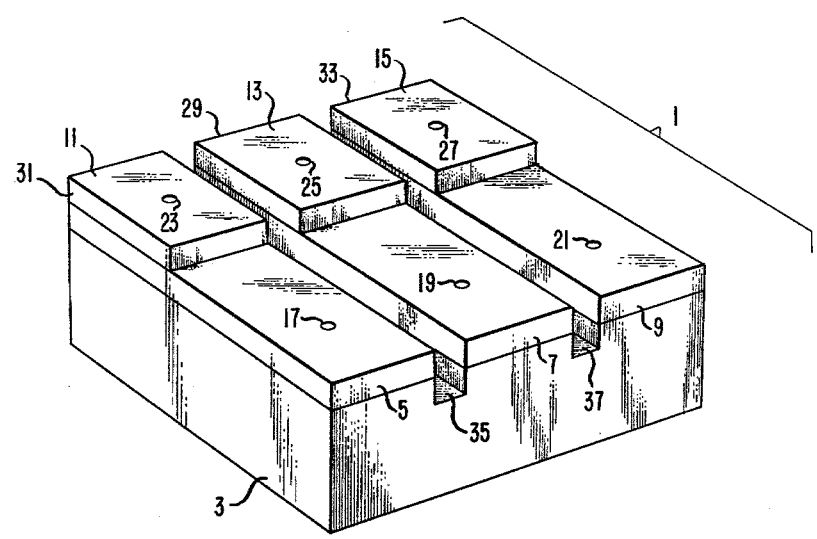
FIG. 1 is a perspective view of one embodiment of this invention.

A first embodiment of the invention is shown generally in perspective as 1 in FIG. 1. It comprises an insulating substrate 3 on which are disposed n-type regions 5, 7 and 9. On top of portions of the n-type regions 5, 7 and 9 are disposed p-type regions 11, 13 and 15, respectively. Regions 7 and 13 form light emitting diode (LED) 29, and regions 5 and 11, and 9 and 15 form photodetectors 31 and 33, respectively. Electrical contacts 17, 19 and 21 are made to the n-type regions 5, 7 and 9, respectively. Electrical contacts 23, 25 and 27 are made to p-type regions 11, 13 and 15, respectively. Electrical contacts 19 and 25 form the input terminals. Electrical connections (not shown) are made between contacts 23 and 27, and between contacts 17 and 21. The two output terminals are formed by electrical contacts 17 and 21, and 23 and 27, respectively. LED 29 is spaced from photodetectors 31 and 33 by channels 35 and 37, respectively. Channels 35 and 37 optically couple LED 29 with photodetectors 31 and 33, respectively.

The device is conveniently fabricated by epitaxially growing the semiconductor material on the substrate. The semiconductor is doped in situ during the epitaxial growth to form the p-n junction. The dopants in the n-type and p-type regions may be the same or different. For example, amphoteric silicon doping may be used with (GaAl)As to form n-type and p-type regions. The conductivity type of the layer is determined by the temperature during growth. Alternatively, a tellerium doped n-type (GaAl)As layer may be grown first, and then a germanium doped p-type (GaAl)As layer may be grown. Other methods of growing and doping the semiconductor will be readily apparent to those skilled in the art.

Channels 35 and 37 are formed by conventional and well known techniques such as etching or sawing. To achieve the desired electrical isolation between the LED and photodetectors, the channels extend a short distance, typically 50μ, into the substrate. If etching or sawing is used to form the channels, the optical coupling between the LED and photodetectors may be improved by placing an electrically nonconducting material having a refractive index greater than air within the channels. A conveniently used material is silicone epoxy which has a refractive index of approximately 1.5. The electrical contacts to both the n-type and p-type regions are also made in conventional and well known manner. For example, a portion of the p-type region of each photodetector and the LED may be removed by etching through photolithographically-defined masks to permit electrical contacts 17, 19 and 21 to be made directly to the n-type regions.

The semiconductor used for the monolithic opto-isolator may be any that may be grown or fabricated with a bandgap that varies with distance from the substrate, i.e., the semiconductor has a graded bandgap. The graded bandgap is conveniently obtained by using a semiconductor material, such as (GaAl)As, that has a bandgap that varies with compositional variations. The bandgap varies in a manner that permits light from the LED to be absorbed by the photodetector. In other words, a portion of the photodetector has a bandgap that is less than the bandgap of the light emitting region of the LED. This permits some of the emitted light to be absorbed in the photodetector. Light having an energy less than the bandgap of the photodetector will not be absorbed by the photodetector. Efficient charge collection requires that the photons be absorbed within several diffusion lengths of the photodetector p-n junction. Exemplary materials include Group II-VI and Group III-IV compounds and mixtures thereof. A preferred material is (GaAl)As with the desired graded bandgap obtained by varying the Ga and Al concentrations. The composition varies from approximately $Ga_{0.7}Al_{0.3}As$ at the substrate to GaAs at the point most remote from the substrate and has the approximate composition, $Ga_{0.92}Al_{0.08}As$, at the p-n junction of the LED. The growth techniques described result in a monotonic variation in bandgap with distance from the substrate.

The thicknesses of the n- and p-type regions are not critical, but are conveniently between 40 to 60 and 100 to 150 microns, respectively for (GaAl)As. The thickness of the n-type region is not crucial, but the p-type region should be at least 100 microns thick to obtain efficient photon emission and absorption. The diffusion length undergoes an apparent increase because of the photoluminescence generated by self-absorptions of photons produced by a prior process. The p-type region should be at least several diffusion lengths thick to obtain the maximum increase in efficiency that results from the apparent increase in diffusion length.

The channel widths are conveniently between 25 and 85 microns. The lower limit in channel width is imposed by the practical difficulties involved in fabrication and the requirement of electrical isolation between LED and photodetector. The upper limit is imposed by decreased coupling efficiency that results with increased spacing.

The substrate, e.g., chromium doped GaAs, should have a resistivity no smaller than $10^4$ ohm.cm for a breakdown voltage of approximately 1000 v. A smaller resistivity can be used if the smaller breakdown voltage that will result can be tolerated.

In device operation, the LED p-n junction is forward biased, and the photodetector p-n junctions are reverse biased. Radiation is emitted outwardly from the LED, and the photodetector acts as an edge receiving photodiode.

Figure 2:
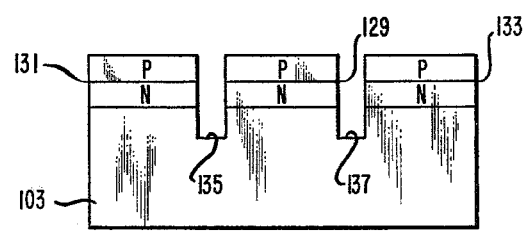
FIG. 2 is a cross-sectional view of the embodiment shown in FIG. 1.

FIG. 2 is a cross-sectional view of the embodiment shown in perspective in FIG. 1. The substrate 103 is a chromium doped gallium arsenide layer having a resistivity of $10^6$ ohm.cm. LED 129 is separated from photodetector 131 and 133 by channels 135 and 137, respectively. The epitaxially grown semiconductor layers have a nominal atom composition $Ga_{1-x}Al_xAs$ and are doped with silicon. x varies monotonically from 0.0 at the uppermost point of the p-type layers to 0.3 adjacent to the semi-insulating substrate, and is approximately 0.08 at the p-n junctions. The dopant concentration is $10^{17}/cm^3$. Channels 135 and 137 have a width of approximately 50 μm and extend approximately 50 μm into the substrate. Electrical contacts are made as described in FIG. 1 to LED 129 and to photodetectors 131 and 133. If desired, the channels may be filled, and enhanced optical coupling obtained, with a suitable material such as silicone epoxy, that reduces the refractive index mismatch between the LED and photodetector.

In both the embodiments described with respect to FIGS. 1 and 2 and the others contemplated, growth of the structure is on a semi-insulating substrate, i.e., one having a resistivity of at least $10^4$ ohm.cm, to obtain high isolation voltages. Typically, this minimum resistivity and the minimum channel width of 50 μm permit isolation voltages of at least 1000 volts.

Figure 3:
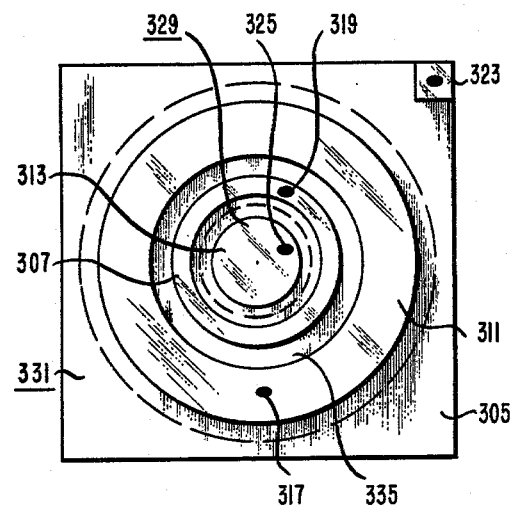
FIG. 3 is a top view of a second embodiment of this invention.

A top view of a second embodiment is shown in FIG. 3. In this embodiment, LED 329 is cylindrical and located in the center of the device and is concentrically surrounded by photodetector 331. Both LED 329 and photodetector 331 have n-type regions 307 and 305, respectively, and p-type regions 313 and 311, respectively, adjacent the n-type regions. The LED and photodetector are disposed on an insulating substrate. Channel 335 spaces LED 329 from photodetector 331 and provides electrical isolation and optical coupling between the two devices. If desired, the channel may be filled with an index matching material such as silicone epoxy. Portions of the LED and photodetector are removed to permit external electrical contacts 319 and 323, respectively, directly to the n-type regions of the LED and photodetector. External electrical contacts 325 and 317 are made to the p-type regions of the LED 329 and photodetector 331, respectively. Substrate conductivities and channel widths are as described with respect to FIGS. 1 and 2. When the LED is forward-biased, the radiation is emitted radially outward from the edge of the LED, and the photodiode acts as an edge receiving photodetector. The semiconductor material forming the n-type and p-type regions has a graded bandgap as described for FIG. 1.

Figure 4:
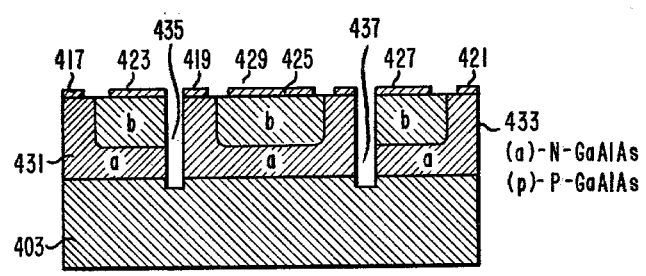
FIG. 4 is a side view of an embodiment of this invention.

Modification of the embodiments described is contemplated if removal of the p-type material, to permit direct electrical contact to the n-type material, is not desired or possible. Such an embodiment is shown in FIG. 4. The geometry may be rectangular as in FIG. 1 or cylindrical as in FIG. 3. Isolated p-type regions, indicated by b, are produced by p-type dopand diffusion by well-known techniques into portions of an n-type layer, indicated by a, which is grown by liquid phase epitaxy on substrate 403. LED 429 is spaced from photodetectors 431 and 433 by channels 435 and 437, respectively. Contacts 417, 419 and 421 are made to the n-type regions, and contacts 423, 425 and 427 are made to the p-type regions. For the rectangular geometry, contacts 417 and 421 are connected, as are contacts 423 and 427. Device parameters and operation are as for the embodiments previously described.

The embodiment described with respect to FIG. 1 may be modified by using only one photodetector or by using one photodetector that is spaced from two LEDs. Further, one photodetector and the LED could be connected in a negative feedback loop to obtain a linear output from the opto-isolator. The embodiment described with respect to FIG. 3 may be modified by placing the photodetector in the center and surrounding it by a concentric LED. Other modifications are readily thought of.

Although the embodiments have been described with the n-type layer adjacent the substrate, embodiments are contemplated with the p-type layer adjacent the substrate. Accordingly, the n-type and p-type regions may be described as having first and second conductivity types.

We claim:

1. An opto-isolator comprising an insulating substrate;
   a light emitting diode disposed on said substrate, said light emitting diode consisting of a semiconductor material and having a first conductivity type region and a second conductivity type region, said regions forming a first p-n junction;
   a photodetector disposed on said substrate, said photodetector consisting of a said semiconductor material and having a first conductivity type region and a second conductivity type region, said regions forming a second p-n junction, said photodetector spaced from said light emitting diode by a channel;
   electrical contacts to said first and second conductivity type regions of said light emitting diode and electrical contacts to said first and second conductivity type regions of said photodetector;
   characterized in that said semiconductor material has a graded bandgap, and said photodetector and said light emitting diode are optically coupled by said channel, said channel extending into said substrate.

2. An opto-isolator as recited in claim 1 in which said semiconductor is selected from the group consisting of Group II-VI compounds and Group III-V compounds and mixtures thereof.

3. An opto-isolator as recited in claim 2 in which said semiconductor material comprises $Ga_{1-x}Al_xAs$, x varying monotonically from a value greater than or equal to 0.0 to a value less than or equal to approximately 0.3.

4. An opto-isolator as recited in claim 3 in which said substrate has a resistivity of at least $10^4$ ohm.cm.

5. An opto-isolator as recited in claim 1 or 4 in which said distance between said photodetector and said light emitting diode is between 25 and 75 microns.

6. An opto-isolator as recited in claim 2 or 4 in which said semiconductor material has the approximate composition $Ga_{0.92}Al_{0.08}As$ at said p-n junction.

* * * * *